United States Patent
Yang

(10) Patent No.: US 9,947,580 B2
(45) Date of Patent: Apr. 17, 2018

(54) INTERCONNECT STRUCTURES WITH ENHANCED ELECTROMIGRATION RESISTANCE

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/651,684

(22) Filed: Jul. 17, 2017

(65) Prior Publication Data

US 2017/0352589 A1 Dec. 7, 2017

Related U.S. Application Data

(63) Continuation of application No. 15/175,438, filed on Jun. 7, 2016, now Pat. No. 9,711,400.

(51) Int. Cl.
*H01L 21/768* (2006.01)
*H01L 23/532* (2006.01)
*H01L 23/522* (2006.01)

(52) U.S. Cl.
CPC .. *H01L 21/76867* (2013.01); *H01L 21/76802* (2013.01); *H01L 21/76843* (2013.01); *H01L 21/76856* (2013.01); *H01L 21/76864* (2013.01); *H01L 21/76877* (2013.01); *H01L 21/76888* (2013.01); *H01L 23/5226* (2013.01); *H01L 23/5329* (2013.01); *H01L 23/53214* (2013.01); *H01L 23/53219* (2013.01); *H01L 23/53223* (2013.01); *H01L 23/53228* (2013.01); *H01L 23/53233* (2013.01); *H01L 23/53238* (2013.01);

(Continued)

(58) Field of Classification Search
CPC ......... H01L 21/76867; H01L 21/76802; H01L 23/53238; H01L 23/53214; H01L 23/53219; H01L 23/53223; H01L 23/5329; H01L 23/53257; H01L 23/53228; H01L 21/76888; H01L 23/53266; H01L 21/76877; H01L 21/76874; H01L 23/5226; H01L 21/76856; H01L 21/76843; H01L 23/53233

See application file for complete search history.

(56) References Cited

U.S. PATENT DOCUMENTS 5,098,860 A 3/1992 Chakravorty et al.
5,930,669 A 7/1999 Uzoh
(Continued)

OTHER PUBLICATIONS

Notice of Allowance dated Jul. 24, 2017 received in U.S. Appl. No. 15/175,718, copy not enclosed.
(Continued)

*Primary Examiner* — William Coleman
(74) *Attorney, Agent, or Firm* — Scully, Scott, Murphy & Presser, P.C.; Louis J. Percello, Esq.

(57) ABSTRACT

Interconnect structures are provided that include an intermetallic compound as either a cap or liner material. The intermetallic compound is a thermal reaction product of a metal or metal alloy of an interconnect metallic region with a metal of either a metal cap or a metal layer. In some embodiments, the metal cap may include a metal nitride and thus a nitride-containing intermetallic compound can be formed. The formation of the intermetallic compound can improve the electromigration resistance of the interconnect structures and widen the process window for fabricating interconnect structures.

17 Claims, 10 Drawing Sheets

(52) U.S. Cl.
CPC .. *H01L 23/53257* (2013.01); *H01L 23/53266* (2013.01)

(56) References Cited

U.S. PATENT DOCUMENTS

| | | |
|---|---|---|
| 5,933,753 A | 8/1999 | Simon et al. |
| 6,144,099 A | 11/2000 | Lopatin et al. |
| 6,383,920 B1 | 5/2002 | Wang et al. |
| 6,429,519 B1 | 8/2002 | Uzoh |
| 6,495,200 B1 | 12/2002 | Chan et al. |
| 6,780,772 B2 | 8/2004 | Uzoh et al. |
| 6,911,229 B2 | 6/2005 | Andriacacos et al. |
| 7,419,903 B2 | 9/2008 | Haukka et al. |
| 7,470,617 B2 | 12/2008 | Chebian et al. |
| 7,694,413 B2 | 4/2010 | Johnston et al. |
| 7,704,886 B2 | 4/2010 | Su et al. |
| 7,902,061 B2 | 3/2011 | Clevenger et al. |
| 7,972,970 B2 | 7/2011 | Mayer et al. |
| 8,013,446 B2 | 9/2011 | Yang et al. |
| 8,039,966 B2 | 10/2011 | Yang et al. |
| 8,044,519 B2 | 10/2011 | Watanabe et al. |
| 8,736,055 B2 | 5/2014 | Kolics et al. |
| 9,252,049 B2 | 2/2016 | Peng et al. |
| 2007/0287294 A1 | 12/2007 | Ko et al. |
| 2014/0145332 A1 | 5/2014 | Ryan et al. |
| 2015/0056385 A1 | 2/2015 | Ishizaka et al. |
| 2015/0325477 A1 | 11/2015 | Shaviv et al. |
| 2015/0357236 A1 | 12/2015 | Edelstein et al. |
| 2016/0086849 A1 | 3/2016 | Gluschenkov et al. |

OTHER PUBLICATIONS

List of IBM Patents or Patent Applications Treated As Related dated Jul. 14, 2017, 2 pages.

INTERCONNECT STRUCTURES WITH ENHANCED ELECTROMIGRATION RESISTANCE

BACKGROUND

The present application relates to semiconductor technology. More particularly, the present application relates to interconnect structures which contain an intermetallic compound (i.e., metal alloy), as a cap and/or a liner, that is formed by reacting an interconnect metal or metal alloy of an interconnect metallic region with a metal of either a metal cap or a metal layer. The present application also relates to methods of forming such interconnect structures.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene interconnect structures. The interconnect structures typically include copper, Cu, since Cu based interconnects provide higher speed signal transmission between large numbers of transistors on a complex semiconductor chip as compared with aluminum, Al, based interconnects.

In semiconductor interconnect structures, electromigration (EM) has been identified as one metal failure mechanism. Electromigration is the transport of material caused by the gradual movement of the ions in a conductor due to the momentum transfer between conducting electrons and diffusing metal atoms. The effect is important in applications where high direct current densities are used, such as in microelectronics and related structures. As the structure size decreases, the practical significance of EM increases.

EM is one of the worst reliability concerns for very large scale integrated (VLSI) circuits and manufacturing since the 1960's. The problem not only needs to be overcome during the process development period in order to qualify the process, but it also persists through the lifetime of the chip. Voids are created inside the metal conductors of interconnect structures due to metal ion movement caused by the high density of current flow.

Although the fast diffusion path in metal interconnect structures varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction to the bottom of the interconnect, which eventually results in a circuit dead opening.

It has been demonstrated that by replacing the Cu/dielectric interface with a Cu/metal interface can enhance electromigration resistance by greater than 100 times. Prior art metal caps such as CoWP require that a high quality interface be present between the Cu interconnect region and the metal cap. The need of a high quality interface between the Cu interconnect region and the metal cap reduces the process window for forming interconnect structures. As such, a need exists to provide methods that widen the process window for fabricating interconnect structures having high electromigration resistance.

SUMMARY

Interconnect structures are provided that include an intermetallic compound as either a cap or liner material. The intermetallic compound is a thermal reaction product of a metal or metal alloy of an interconnect metallic region and a metal of either a metal cap or a metal layer. In some embodiments, the metal cap may include a metal nitride and thus a nitride-containing intermetallic compound can be formed. The formation of the intermetallic compound can improve the electromigration resistance of the interconnect structures and widen the process window for fabricating interconnect structures.

In one aspect of the present application, interconnect structures are provided that have improved electromigration resistance. In one embodiment of the present application, the interconnect structure includes at least one interconnect metallic region of an interconnect metal or metal alloy, M1, embedded in an opening located in an interconnect dielectric material layer, wherein a topmost surface of the at least one interconnect metallic region is coplanar with a topmost surface of the interconnect dielectric material layer. An intermetallic compound containing cap is located on the topmost surface of the at least one interconnect metallic region. In this embodiment, the intermetallic compound containing cap is a metal alloy including M1 and another metal, M2, wherein M2 is different from M1. A dielectric capping layer is located on exposed portions of the topmost surface of the interconnect dielectric material and on sidewall surfaces and a topmost surface of the intermetallic compound containing cap.

In another embodiment of the present application, the interconnect structure includes at least one interconnect metallic region of an interconnect metal or metal alloy, M1, embedded in an opening located in an interconnect dielectric material layer, wherein a topmost surface of the at least one interconnect metallic region is coplanar with a topmost surface of the interconnect dielectric material layer. A nitride-containing intermetallic compound containing cap is located on the topmost surface of the at least one interconnect metallic region. In this embodiment, the nitride-containing intermetallic compound containing cap is a metal alloy including M1 and another metal, M3, and nitrogen, wherein M3 is different from M1. A dielectric capping layer is located on exposed portions of the topmost surface of the interconnect dielectric material and on sidewall surfaces and a topmost surface of the nitride-containing intermetallic compound containing cap.

In yet another embodiment of the present application, the interconnect structure includes at least one interconnect metallic region of an interconnect metal or metal alloy, M1, embedded in an opening located in an interconnect dielectric material layer, wherein a topmost surface of the at least one interconnect metallic region is coplanar with a topmost surface of the interconnect dielectric material layer. A material stack of, from bottom to top, a diffusion barrier liner and an intermetallic compound containing liner separates the at least one interconnect metallic region from the interconnect dielectric material layer, wherein the intermetallic compound containing liner includes M1 and another metal, M2, wherein M2 is different from M1.

In another aspect of the present application, methods of forming interconnect structures are provided that have improved electromigration resistance. In one embodiment, the method may include forming at least one interconnect metallic region of an interconnect metal or metal alloy, M1, embedded in an opening located in an interconnect dielectric material layer, wherein a topmost surface of the at least one interconnect metallic region is coplanar with a topmost surface of the interconnect dielectric material layer. Next, a metal cap of metal, M2, is selectively deposited on the topmost surface of the at least one interconnect metallic region, wherein M2 is different from M1. The metal cap is thereafter converted into an intermetallic compound containing cap, wherein the intermetallic compound containing cap is a thermal reaction product of M1 and M2.

In another embodiment, the method may include forming at least one interconnect metallic region of an interconnect metal or metal alloy, M1, embedded in an opening located in an interconnect dielectric material layer, wherein a topmost surface of the at least one interconnect metallic region is coplanar with a topmost surface of the interconnect dielectric material layer. Next, a non-selective metal layer of metal, M3, is deposited on the topmost surface of the at least one interconnect metallic region and on the topmost surface of the interconnect dielectric material layer, wherein M3 is different from M1. The metal layer is first converted into a metal nitride layer, M3-N, and thereafter a portion of the metal nitride layer that is located directly on the at least one interconnect metallic region is converted into a nitride-containing intermetallic compound containing cap, wherein the nitride-containing intermetallic compound containing cap is a thermal reaction product of M1 and M3-N. Next, remaining portions of the metal nitride layer are removed selective to the nitride-containing intermetallic compound containing cap. A dielectric capping layer is then formed on exposed portions of the topmost surface of the interconnect dielectric material and on sidewall surfaces and a topmost surface of the nitride-containing intermetallic compound containing cap.

In yet another embodiment, the method may include forming an opening in an interconnect dielectric material layer. A diffusion barrier layer is then formed on the interconnect dielectric material and within a portion of the opening. Next, a metal layer of metal, M2, is formed on the diffusion barrier layer. A layer of an interconnect metal or metal alloy, M1, is then formed on the metal layer. The metal layer is thereafter converted into an intermetallic compound containing layer, wherein the intermetallic compound containing liner is a thermal reaction product of M1 and M2.

DETAILED DESCRIPTION

Figure 1:
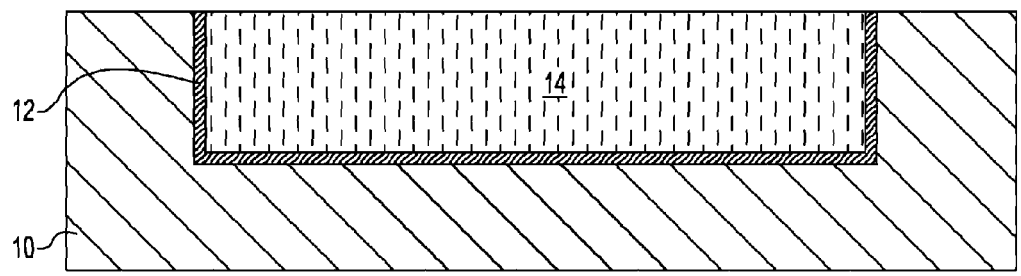
FIG. 1 is a cross sectional view of an exemplary semiconductor structure including at least one interconnect metallic region embedded in an interconnect dielectric material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including at least one interconnect metallic region 14 embedded in an interconnect dielectric material layer 10 that can be employed in accordance with an embodiment of the present application. As is shown, a diffusion barrier liner 12 is positioned between the at least one interconnect metallic region 14 and the interconnect dielectric material layer 10.

By "embedded" it is meant that are least a portion of each interconnect metallic region 14 is contained between a topmost surface and a bottommost surface of the interconnect dielectric material layer 10. In some embodiments, and as shown, the topmost surface of each interconnect metallic region 14 is coplanar with a topmost surface of the interconnect dielectric material layer 10 and a bottommost surface of the each interconnect metallic region 14 is located between the topmost surface and the bottommost surface of the interconnect dielectric material layer 10.

The interconnect dielectric material layer 10 may be located upon a substrate (not shown in the drawings of the present application). The substrate, which is not shown, may be composed of a semiconducting material, an insulating material, a conductive material or any combination thereof. When the substrate is composed of a semiconducting material, any material having semiconductor properties such as, for example, Si, SiGe, SiGeC, SiC, Ge alloys, III/V compound semiconductors or II/VI compound semiconductors, may be used. In addition to these listed types of semiconducting materials, the substrate that is located beneath the interconnect dielectric material layer 10 can be a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or any combination thereof including multilayers. When the substrate is a conductive material, the substrate may include, for example, polySi, an elemental metal, alloys of elemental metals, a metal silicide, a metal nitride or any combination thereof including multilayers. When the substrate is composed of a semiconducting material, one or more semiconductor devices such as, for example, complementary metal oxide semiconductor (CMOS) devices can be fabricated thereon. When the substrate is composed of a combination of an insulating material and a conductive material, the substrate may represent an underlying interconnect level of a multilayered interconnect structure.

The interconnect dielectric material layer 10 that is employed in the present application may be composed of any interlevel or intralevel dielectric including inorganic dielectrics or organic dielectrics. In one embodiment, the interconnect dielectric material layer 10 may be non-porous. In another embodiment, the interconnect dielectric material layer 10 may be porous. Some examples of suitable dielectrics that can be used as the interconnect dielectric material layer 10 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The interconnect dielectric material layer 10 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the interconnect dielectric material layer 10 may vary depending upon the type of dielectric material(s) used. In one example, the interconnect dielectric material layer 10 may have a thickness from 50 nm to 1000 nm. Other thicknesses that are lesser than, or greater than, the aforementioned thickness range may also be employed in the present application for the thickness of the interconnect dielectric material layer 10.

The at least one interconnect metallic region 14 can be formed by first providing at least one opening into the interconnect dielectric material layer 10, and then filling the at least one opening with an interconnect metal or metal alloy. The at least one opening that is formed into the interconnect dielectric material layer 10 can be formed utilizing a patterning process. In one embodiment, the patterning process may include lithography and etching. The lithographic process includes forming a photoresist (not shown) atop the interconnect dielectric material layer 10, exposing the photoresist to a desired pattern of radiation and developing the exposed photoresist utilizing a conventional resist developer. The photoresist may be a positive-tone photoresist, a negative-tone photoresist or a hybrid-tone photoresist. In some embodiments, a hard mask such as, for example, a layer of silicon dioxide and/or silicon nitride, can be interposed between the photoresist and the interconnect dielectric material layer 10. The etching process includes a dry etching process (such as, for example, reactive ion etching, ion beam etching, plasma etching or laser ablation), and/or a wet chemical etching process. Typically, reactive ion etching is used in providing the at least one opening into at least the interconnect dielectric material layer 10. In some embodiments, the etching process includes a first pattern transfer step in which the pattern provided to the photoresist is transferred to the hard mask, the patterned photoresist is then removed by an ashing step, and thereafter, a second pattern transfer step is used to transfer the pattern from the patterned hard mask into the underlying interconnect dielectric material layer 10.

The depth of the at least one opening that is formed into the interconnect dielectric material layer 10 (measured from the topmost surface of the interconnect dielectric material layer 10 to the bottom wall of the at least one opening) may vary. In some embodiments, the at least one opening may extend entirely through the interconnect dielectric material layer 10. In yet other embodiments, the at least one opening stops within the interconnect dielectric material layer 10 itself. In yet further embodiments, different depth openings can be formed into the interconnect dielectric material layer 10.

The at least one opening that is formed into the interconnect dielectric material layer 10 may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIG. 1, and by way of an example, the at least one opening that houses the at least one interconnect metallic region 14 is shown as a line opening. When a via or line is formed, a single damascene process (including the above mentioned lithography and etching steps) can be employed. When a combined via/line is formed a dual damascene process (including at least one iteration of the above mentioned lithography and etching steps) can be employed.

Next, a diffusion barrier material which provides diffusion barrier liner 12 can be formed within the at least one opening and atop the interconnect dielectric material layer 10; in some embodiments, the diffusion barrier material can be omitted. The diffusion barrier material includes Ta, TaN, Ti, TiN, Ru, RuN, RuTa, RuTaN, W, WN or any other material that can serve as a barrier to prevent a conductive material such as copper from diffusing there through. The thickness of the diffusion barrier material may vary depending on the deposition process used as well as the material employed. In some embodiments, the diffusion barrier material may have a thickness from 2 nm to 50 nm; although other thicknesses for the diffusion barrier material are contemplated and can be employed in the present application. The diffusion barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the diffusion barrier material. In cases in which the interconnect metal or metal alloy is be subsequently and directly formed on the diffusion barrier material, the optional plating seed layer is not needed. The optional plating seed layer is employed to selectively promote subsequent electroplating of a pre-selected interconnect metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

An interconnect metal or metal alloy is then formed within the at least one opening and atop the interconnect dielectric material layer 10. The interconnect metal or metal alloy may be formed by a deposition process including chemical vapor deposition (CVD), plasma enhanced chemical vapor deposition (PECVD), sputtering, chemical solution deposition or plating. In one embodiment, a bottom-up plating process is employed in forming interconnect metal or metal alloy. The interconnect metal or metal alloy may include copper (Cu), aluminum (Al) or a Cu—Al alloy. In the present application, M1, is used to define the interconnect metal or metal alloy that provides the least one interconnect metallic region 14.

Following the deposition of the interconnect metal or metal alloy, a planarization process such as, for example, chemical mechanical polishing (CMP) and/or grinding, can be used to remove all the interconnect metal or metal alloy (i.e., overburden material) that is present outside the at least one opening forming the at least one interconnect metallic region 14 embedded within the interconnect dielectric material layer 10. The planarization stops on a topmost surface of the interconnect dielectric material layer 10 providing the coplanar structure illustrated in FIG. 1. If a diffusion barrier material and an optional plating seed layer are present, the planarization process would provide a U-shaped diffusion barrier liner (as shown by element 12) and a U-shaped plating seed layer (not shown) within the at least one opening. The U-shaped diffusion barrier liner 12 and the U-shaped plating seed layer would be interposed between the interconnect dielectric material layer 10 and the at least one interconnect metallic region 14. Also, the U-shaped diffusion barrier (i.e., diffusion barrier liner 12) and the U-shaped plating seed layer would each have a topmost surface that is coplanar with a topmost surface of both the interconnect dielectric material layer 10 and the at least one interconnect metallic region 14.

Figure 2:
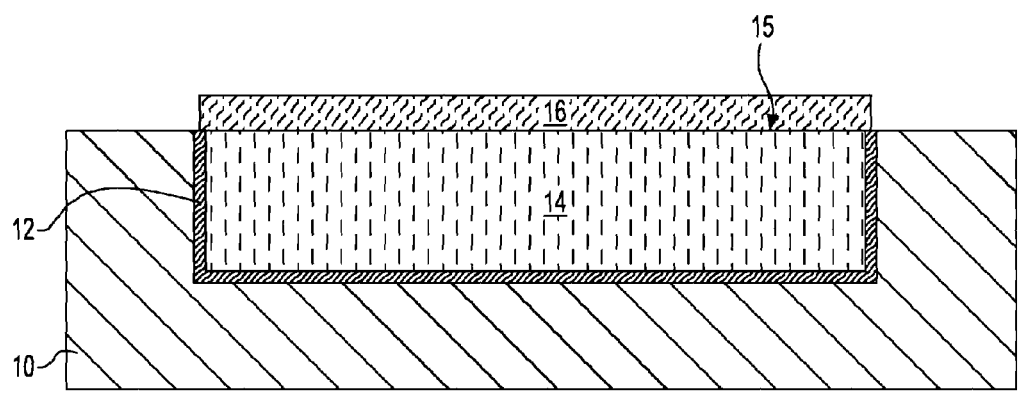
FIG. 2 is a cross sectional view of the exemplary semiconductor structure of FIG. 1 after selective deposition of a metal cap on an exposed surface of the at least one interconnect metallic region.

Referring now to FIG. 2, there is illustrated the exemplary semiconductor structure of FIG. 1 after selective deposition of a metal cap 16 on an exposed surface of the at least one interconnect metallic region 14. In this embodiment of the present application, and since a selective deposition process is employed in forming the metal cap 16, the metal cap 16 does not extend onto the topmost surface of the interconnect dielectric material layer 10. Typically, and in this embodiment, the metal cap 16 is only located on a topmost surface of the at least one interconnect metallic region 14; a portion of the metal cap 16 may extend onto a topmost surface of the diffusion barrier liner 12.

The metal cap 16 is composed of a metal, M2, that is different in composition from the metal or metal alloy, M1, that provides the at least one interconnect metallic region 14. The metal cap 16 may be composed of Al, Hf, Mn, Co, Ru, Ir, Rh, or W. The metal cap 16 may have a thickness from 10 nm to 50 nm. Other thicknesses that are lesser than 10 nm, and greater than 50 nm can also be employed as the thickness of the metal cap 16.

The selective deposition of the metal cap 16 may include chemical vapor deposition (CVD), plasma enhanced chemical vapor deposition (PECVD), atomic layer deposition (ALD), or electroless deposition. The selective deposition of the metal cap 16 is performed utilizing a carrier gas such as, for example, helium, in which the flow rate thereof is controlled so as to be less than 20 sccm. In one example, the flow rate of the carrier gas used during the selective deposition of the metal cap 16 is from 1 sccm to 15 sccm. The selective deposition can be performed at a temperature from 100° C. to 500° C.

At this point of the present application, and as shown in FIG. 2, a well defined material interface 15 exists between the metal cap 16 and the at least one interconnect metallic region 14. For structures containing such a well defined interface 15, the quality of the interface 15 is critical for achieving electromigration resistance, e.g., free of oxygen and a limited amount of carbon.

Figure 3:
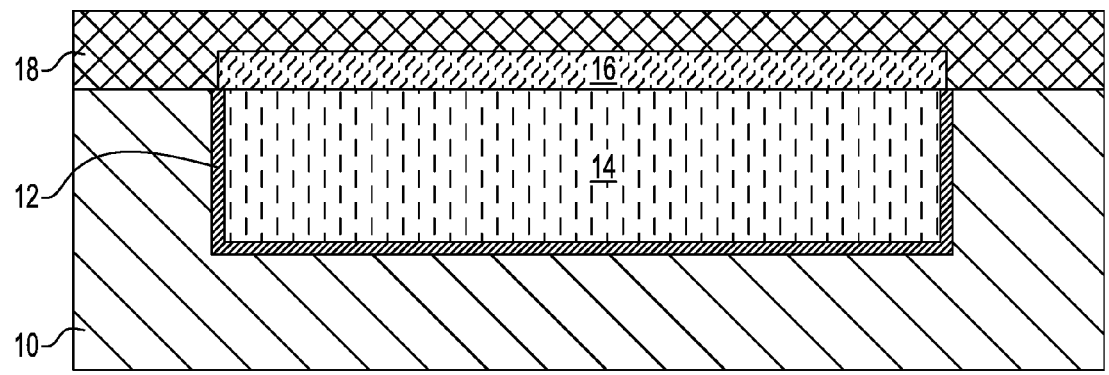
FIG. 3 is a cross sectional view of the exemplary semiconductor structure of FIG. 2 after forming a dielectric capping layer on exposed surfaces of the interconnect dielectric material and exposed surfaces of the metal cap.

Referring now to FIG. 3, there is illustrated the exemplary semiconductor structure of FIG. 2 after forming a dielectric capping layer 18 on exposed surfaces of the interconnect dielectric material layer 10 and exposed surfaces (i.e., topmost and sidewalls) of the metal cap 16.

The dielectric capping layer 18 can include any suitable dielectric capping material such as, for example, SiC, $Si_4NH_3$, $SiO_2$, a carbon doped oxide, a nitrogen and hydrogen doped silicon carbide SiC(N,H) or multilayers thereof. The dielectric capping layer 18 can be formed utilizing a conventional deposition process such as, for example, chemical vapor deposition, plasma enhanced chemical vapor deposition, chemical solution deposition, evaporation, or atomic layer deposition. The thickness of the dielectric capping layer 18 may vary depending on the technique used to form the same as well as the material make-up of the layer. Typically, the dielectric capping layer 18 has a thickness from 15 nm to 100 nm. Other thicknesses that are lesser than 15 nm, or greater 100 nm may also be employed as the thickness of the dielectric capping layer 18.

Figure 4:
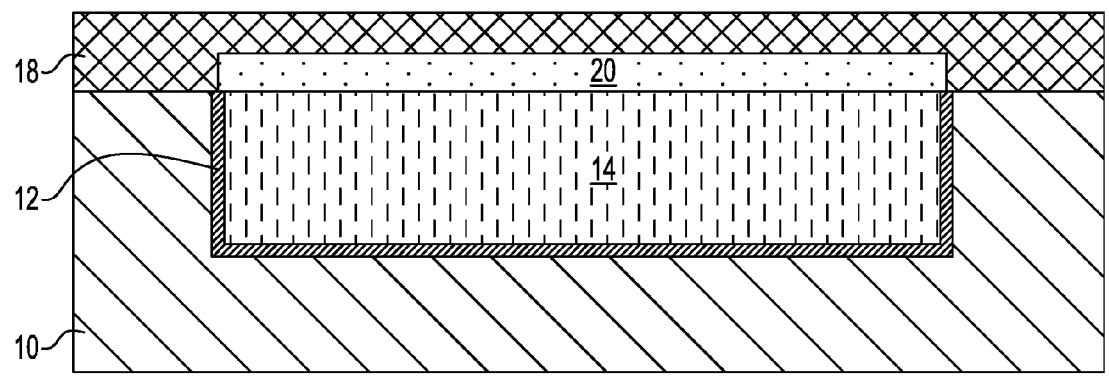
FIG. 4 is a cross sectional view of the exemplary semiconductor structure of FIG. 3 after performing an anneal in which the metal or metal alloy of the at least one interconnect metallic region reacts with the metal of the metal cap forming an intermetallic compound containing cap.

Referring now to FIG. 4, there is illustrated the exemplary semiconductor structure of FIG. 3 after performing an anneal in which the metal or metal alloy, M1, of the at least one interconnect metallic region 14 reacts with the metal, M2, of the metal cap 16 forming an intermetallic compound containing cap 20. During the anneal, migration of M1 into M2 occurs and the metal cap 16 is converted into the intermetallic compound containing cap 20. The intermetallic compounds that are used as the cap or liner in the present application are thermal reaction products that are formed in-situ not by direct deposition. The anneal does not adversely affect the interconnect dielectric material layer 10 or the dielectric capping layer 18. As is shown, the intermetallic compound containing cap has sidewall surfaces that are vertically aligned to sidewall surfaces of the at least one interconnect metallic region 14.

In the present application, the intermetallic compound containing cap 20 is a metal alloy M1-M2, that is formed by annealing and includes a combination of the metal or metal alloy, M1, of the at least one interconnect metallic region 14 and the metal, M2, of the metal cap 16. For example, when the at least one interconnect metallic region 14 includes Cu, and the metal cap 16 includes Co, an intermetallic compound (i.e., alloy) of Cu—Co is formed.

The formation of the intermetallic compound containing cap 20 removes the well defined interface between the cap and the underlying at least one interconnect metallic region thus relaxing the need for providing a high quality interface. The intermetallic compound containing cap 20 that is formed has a graded concentration of the metal or metal alloy, M1, of the at least one interconnect metallic region 14 that is greatest at the interface between the intermetallic compound containing cap 20 and the at least one interconnect metallic region 14 and decreases upwards to the interface formed between the topmost surface of the intermetallic compound containing cap 20 and a surface of the dielectric capping layer 18. Within the at least one interconnect metallic region 14, the concentration of the metal or metal alloy that provides the at least one interconnect metallic region 14 is lower after the anneal than the initial concentration of metal or metal alloy in the at least one interconnect metallic region 14 prior to the anneal.

In one embodiment, the anneal used to provide the intermetallic compound containing cap 20 is a thermal anneal. In one example, the thermal anneal may include a furnace anneal or a hot plate anneal. The thermal anneal may be performed at a temperature from 100° C. to 400° C. Other temperatures can also be employed as long as the selected thermal anneal temperature causes the formation of the intermetallic compound containing cap 20.

The thermal anneal is typically performed in a nitrogen-containing ambient. The nitrogen-containing ambients that can be employed in the present application include, but are not limited to, $N_2$, $NH_3$, $NH_4$, NO, or $NH_x$ wherein x is between 0 and 1. Mixtures of the aforementioned nitrogen-containing ambients can also be employed in the present application. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, $H_2$ can be used to dilute the nitrogen-containing ambient. Notwithstanding whether the nitrogen-containing ambient is employed neat or diluted, the content of nitrogen within the nitrogen-containing ambient employed in the present application is typically from 10% to 100%, with a nitrogen content within the nitrogen-containing ambient from 50% to 80% being more typical.

The duration of the thermal anneal may vary depending upon the temperature used during the thermal anneal. In one embodiment and for a temperature from 100° C. to 400° C., the thermal anneal may be performed for a duration of 20 minutes to 3 hours.

In addition to a thermal anneal, the intermetallic compound containing cap 20 may be formed utilizing a laser anneal. In such an embodiment, the laser anneal may be performed at a temperature from 400° C. to 800° C. The laser anneal may be performed in one of the nitrogen-containing ambients mentioned above; a neat or diluted nitrogen-containing ambient may be used in the laser anneal process. The duration of the laser anneal may vary depending upon the type of laser employed. In one embodiment, the laser anneal may be performed for a duration of 5 seconds to 5 minutes.

Figure 5:
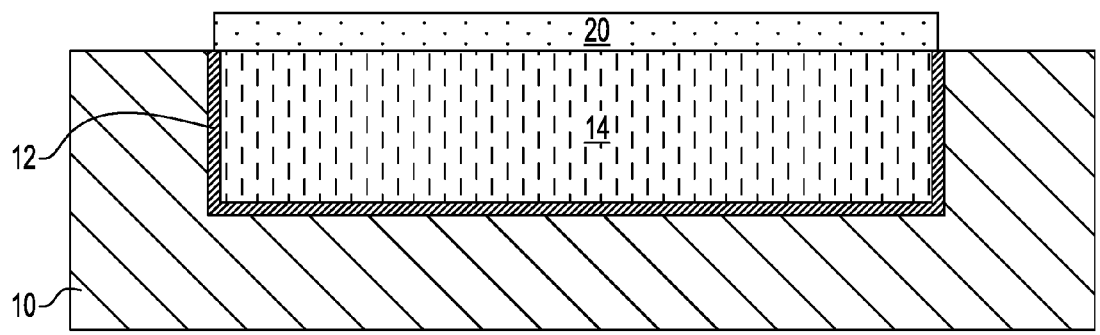
FIG. 5 is a cross sectional view of the exemplary semiconductor structure of FIG. 2 after performing an anneal in which the metal or metal alloy of the at least one interconnect metallic region reacts with the metal of the metal cap forming an intermetallic compound containing cap.

Referring now to FIG. 5, there is illustrated the exemplary semiconductor structure of FIG. 2 after performing an anneal in which the metal or metal alloy, M1, of the at least one interconnect metallic region 14 reacts with the metal, M2, of the metal cap 16 forming an intermetallic compound containing cap 20 (i.e., M1-M2). Unlike the previous embodiment, the anneal is performed without the presence of the dielectric capping layer 18.

The anneal used in this embodiment of the present application includes one of the anneals mentioned above in forming the intermetallic compound containing cap 20 within the exemplary semiconductor structure shown in FIG. 4. The intermetallic compound containing cap 20 of this embodiment of the present application is the same as that mentioned above in the exemplary structure shown in FIG. 4.

Figure 6:
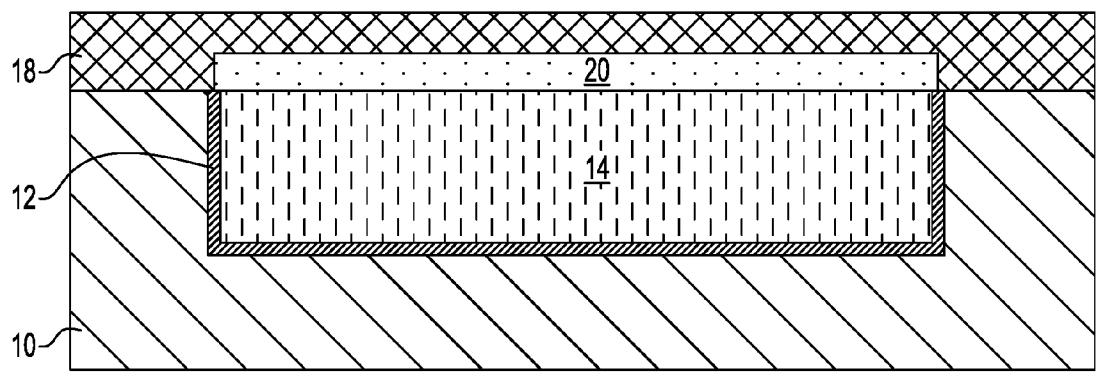
FIG. 6 is a cross sectional view of the exemplary semiconductor structure of FIG. 5 after forming a dielectric capping layer on exposed surfaces of the interconnect dielectric material and exposed surfaces of the intermetallic compound containing cap.

Referring now to FIG. 6, there illustrated the exemplary semiconductor structure of FIG. 5 after forming a dielectric capping layer 18 on exposed surfaces of the interconnect dielectric material layer 10 and exposed surfaces (topmost and sidewall surfaces) of the intermetallic compound containing cap 20. The dielectric capping layer 18 may include one of the dielectric capping materials mentioned above in forming the dielectric capping layer 18 in the exemplary semiconductor structure shown in FIG. 3. The dielectric capping layer 18 may be formed and have a thickness as described.

Figure 7:
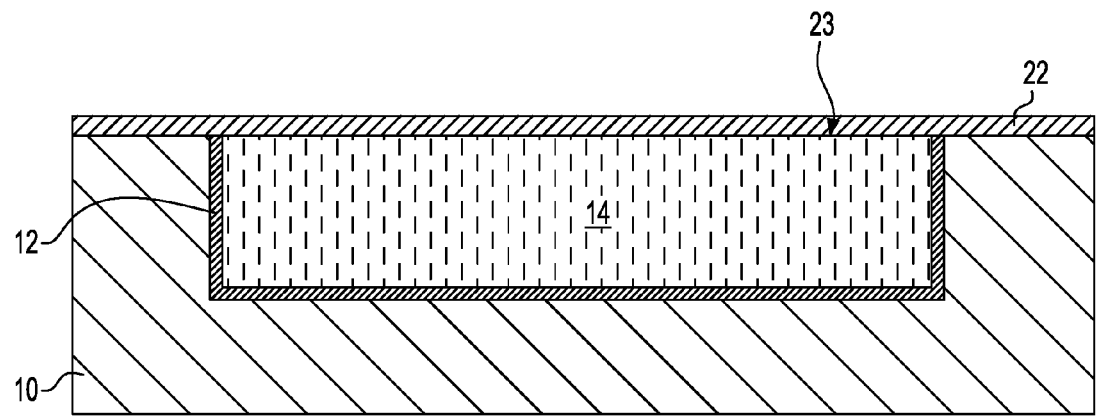
FIG. 7 is a cross view of the exemplary semiconductor structure of FIG. 1 after non-selective deposition of a metal layer on exposed surfaces of the interconnect dielectric material layer and the at least one interconnect metallic region.

Referring now to FIG. 7, there is illustrated the exemplary semiconductor structure of FIG. 1 after non-selective deposition of a metal layer 22 on exposed surfaces of the interconnect dielectric material layer 10 and the at least one interconnect metallic region 14, and if present, the diffusion barrier liner 12.

The metal layer 22 is a continuous layer (i.e., a layer without any breaks or voids) that is formed on the exposed surfaces of the exemplary semiconductor structure of FIG. 1. The metal layer 22 is composed of a metal, M3, that is different in composition from the metal or metal alloy, M1, that provides the at least one interconnect metallic region 14. In one embodiment, the metal layer 22 may include Ti or N. In other embodiments, the metal layer 22 may include Al, Hf, Mn, Co, Ru, Ir, Rh or W. The metal layer 22 may have may have a thickness from 10 nm to 25 nm. Other thicknesses that are lesser than 10 nm, and greater than 25 nm can also be employed as the thickness of the metal layer 22.

The non-selective deposition of the metal layer 22 may include chemical vapor deposition (CVD), plasma enhanced chemical vapor deposition (PECVD), atomic layer deposition (ALD), or electroless deposition. The non-selective deposition of the metal layer 22 is performed utilizing a carrier gas such as, for example, helium, in which the flow rate thereof is greater than 300 sccm. In one example, the flow rate of the carrier gas used during the non-selective deposition of the metal layer is from 320 sccm to 375 sccm. The non-selective deposition can be performed at a temperature from 25° C. to 250° C.

At this point of the present application, and as shown in FIG. 7, a well defined material interface 23 exists between the metal layer 22 and the at least one interconnect metallic region 14. For structures containing such a well defined interface 23, the quality of the interface 23 is critical for achieving electromigration resistance, e.g., free of oxygen and a limited amount of carbon.

Figure 8:
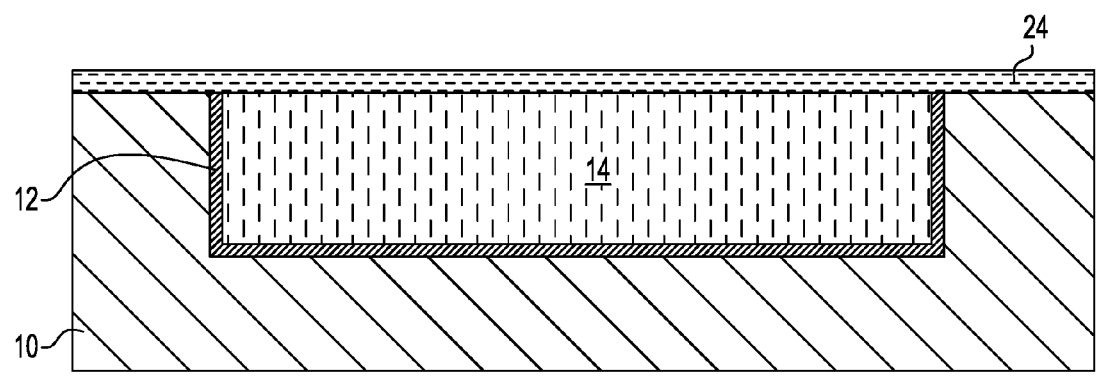
FIG. 8 is a cross sectional view of the exemplary semiconductor structure of FIG. 7 after performing a treatment process that coverts the metal layer into a metal nitride layer.

Referring now to FIG. 8, there is illustrated the exemplary semiconductor structure of FIG. 7 after performing a treatment process that coverts the metal layer 22 into a metal nitride layer 24 (i.e., M3-N). As is shown, the entirety of the metal layer 22 is converted into the metal nitride layer 24. In one embodiment, the metal nitride layer 24 that is formed is composed of TiN or NiN.

In one embodiment, the treatment process that coverts the metal layer 22 into the metal nitride layer 24 is a thermal nitridation process. When a thermal nitridation process is employed, no damage to the interconnect dielectric material layer 10 is observed. The thermal nitridation process that is employed in the present application does not include an electrical bias higher than 200 W. In some embodiments, no electrical bias is performed during the thermal nitridation process. The thermal nitridation process employed in the present application is performed in any nitrogen-containing ambient, which is not in the form of a plasma. The nitrogen-containing ambients that can be employed in the present application include, but are not limited to, $N_2$, $NH_3$, $NH_4$, NO, or $NH_x$ wherein x is between 0 and 1. Mixtures of the aforementioned nitrogen-containing ambients can also be employed in the present application. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, $H_2$ can be used to dilute the nitrogen-containing ambient.

Notwithstanding whether the nitrogen-containing ambient is employed neat or diluted, the content of nitrogen within the nitrogen-containing ambient employed in the present application is typically from 10% to 100%, with a nitrogen content within the nitrogen-containing ambient from 50% to 80% being more typical. In one embodiment, the thermal nitridation process employed in the present application is performed at a temperature from 50° C. to 450° C. In another embodiment, the thermal nitridation process employed in the present application is performed at a temperature from 100° C. to 300° C.

In addition to a thermal nitridation process, the treatment process that coverts the metal layer 22 into the metal nitride layer 24 can include a plasma nitridation process. When a plasma nitridation process is employed, an electrical bias of greater than 200 W can be employed. The plasma nitridation process is performed by generating a plasma from one of the nitrogen-containing ambients that is mentioned above for the thermal nitridation process. In one embodiment, the plasma nitridation process employed in the present application is performed at a temperature from 50° C. to 450° C. In another embodiment, the plasma nitridation process employed in the present application is performed at a temperature from 100° C. to 300° C. The metal nitride layer 24 may include nitrogen in a concentration from 1 atomic percent nitrogen to 50 atomic percent nitrogen. Nitrogen contents of greater than 50 atomic percent, for example, up to 75 atomic present, are also contemplated for the metal nitride layer 24.

Figure 9:
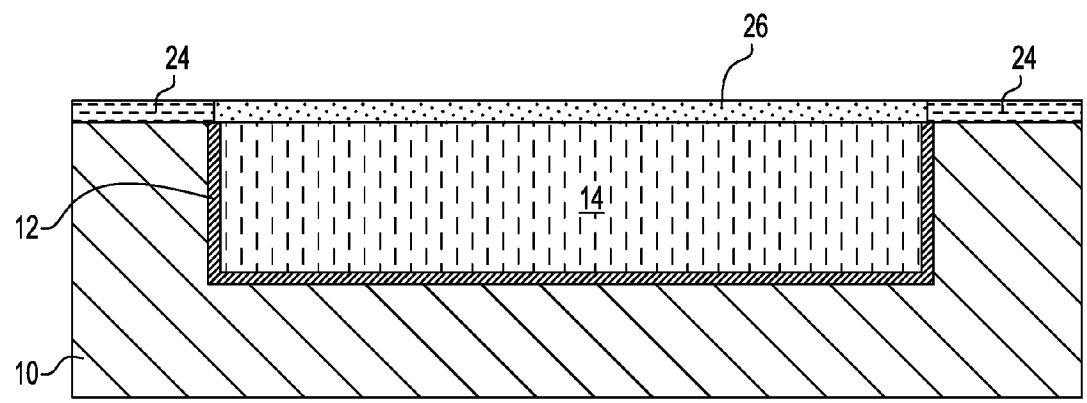
FIG. 9 is a cross sectional view of the exemplary semiconductor structure of FIG. 8 after performing an anneal in which the metal or metal alloy of the at least one interconnect metallic region reacts with a portion of the metal nitride layer that is located directly above the at least one interconnect metallic region to form an intermetallic compound containing cap that further contains nitrogen.

Referring now to FIG. 9, there is illustrated the exemplary semiconductor structure of FIG. 8 after performing an anneal in which the metal or metal alloy, M1, of the at least one interconnect metallic region 14 reacts with a portion of the metal nitride layer 24 (i.e., M3-N) that is located directly above the at least one interconnect metallic region 14 to form an intermetallic compound containing cap 26 that further contains nitrogen (i.e., M1-M3-N).

The intermetallic compound containing cap 26 that further contains nitrogen may be referred to as a nitride-containing intermetallic compound containing cap 26. As is shown, the nitride-containing intermetallic compound containing cap 26 has sidewall surfaces that directly contact sidewall surfaces of remaining portions of the metal nitride layer 24 that are present above at least the interconnect dielectric material layer 10. In some embodiments, the nitride-containing intermetallic compound containing cap 26 is only positioned atop the at least one interconnect metallic region 14. In such an embodiment, the sidewall surfaces of the cap 26 are vertically aligned to the sidewall surfaces of the interconnect metallic region 14. In other embodiments, the nitride-containing intermetallic compound containing cap 26 is positioned atop the at least one interconnect metallic region 14 and a portion of the diffusion barrier liner 12.

The anneal used to form the nitride-containing intermetallic compound containing cap 26 is the same as mentioned above in forming the intermetallic compound containing cap 20.

In the present application, the nitride-containing intermetallic compound containing cap 26 is a nitrided metal alloy that is formed by annealing and includes a combination of the metal or metal alloy, M1, of the at least one interconnect metallic region 14 and the nitrided metal (M3-N) of the metal nitride layer 24. For example, when the at least one interconnect metallic region 14 includes Cu, and the metal nitride layer 24 includes TiN, a nitride-containing intermetallic compound of Cu—TiN is formed. Within the nitride-containing intermetallic compound containing cap 26, the nitrogen content is within the same range as mentioned above for the metal nitride layer 24. The nitride-containing intermetallic compound containing cap 26 has a different etch selectivity in certain etchants as compared to the remaining portions of the metal nitride layer 24.

The formation of the nitride-containing intermetallic compound containing cap 26 removes the well defined interface between the cap and the underlying at least one interconnect metallic region thus relaxing the need for providing a high quality interface. Like the previous embodiment of the present application, the nitride-containing intermetallic compound containing cap 26 has a graded concentration of M1, wherein a content of M1 in the nitride-containing intermetallic compound containing cap is greatest at an interface formed between the nitride-containing intermetallic compound containing cap and the at least one interconnect metallic region 14, and decreases upwards from the interface.

Figure 10:
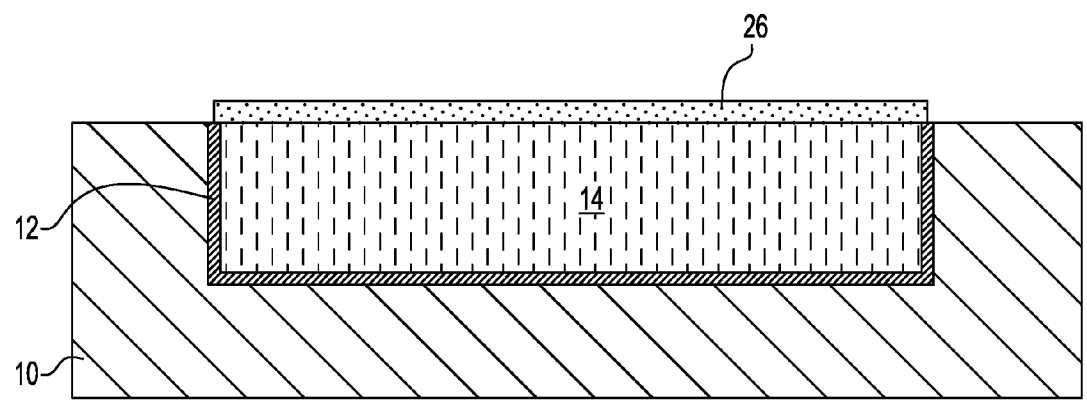
FIG. 10 is a cross sectional view of the exemplary semiconductor structure of FIG. 9 after removing the remaining portions of the metal nitride layer selective to the intermetallic compound containing cap.

Referring now to FIG. 10, there is illustrated the exemplary semiconductor structure of FIG. 9 after removing the metal nitride layer 24 selective to the nitride-containing intermetallic compound containing cap 26. The metal nitride layer 24 can be removed utilizing an etch that removes the metal nitride layer 24 selective to the nitride-containing intermetallic compound containing cap 26. In one example, and when the metal nitride layer 24 include TiN, and the nitride-containing intermetallic compound containing cap 26 is composed of an intermetallic compound of Cu—TiN, a mixture of acid chemistries can be used to remove the metal nitride layer 24 selective to the nitride-containing intermetallic compound containing cap 26.

Figure 11:
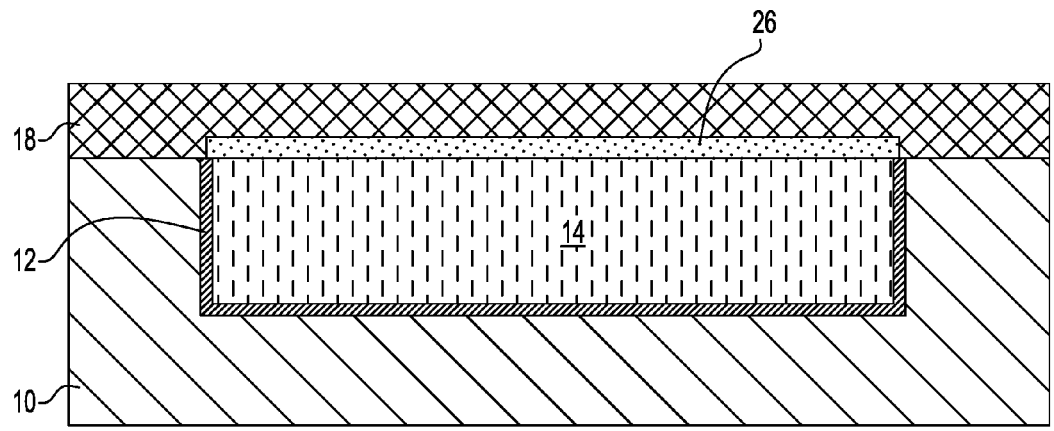
FIG. 11 is a cross sectional view of the exemplary semiconductor structure of FIG. 10 after forming a dielectric capping layer on exposed surfaces of the interconnect dielectric material and exposed surfaces of the intermetallic compound containing cap.

Referring now to FIG. 11, there is illustrated the exemplary semiconductor structure of FIG. 10 after forming a dielectric capping layer 18 on exposed surfaces of the interconnect dielectric material layer and exposed surfaces (topmost and sidewall surfaces) of the nitride-containing intermetallic compound containing cap 26. The dielectric capping layer 18 may include one of the dielectric capping materials mentioned above in forming the dielectric capping layer 18 in the exemplary semiconductor structure shown in FIG. 3. The dielectric capping layer 18 may be formed and have a thickness as described.

Figure 12:
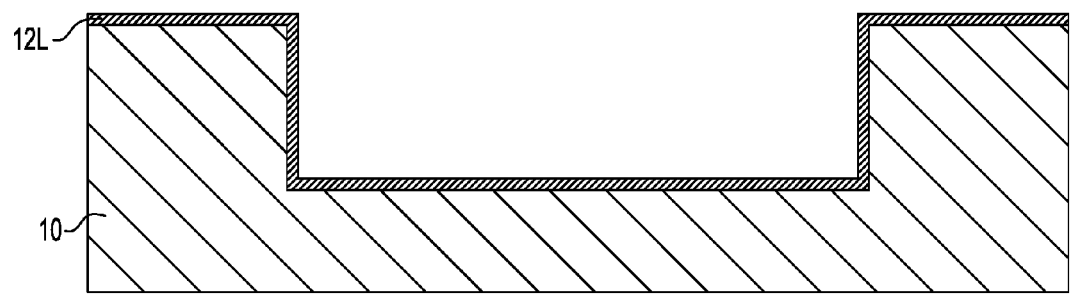
FIG. 12 is a cross sectional view of another exemplary semiconductor structure including a diffusion barrier material layer located on an interconnect dielectric material containing at least one opening that can be employed in accordance with another embodiment of the present application.

Referring now to FIG. 12, there is illustrated another exemplary semiconductor structure including a diffusion barrier material layer 12L located on an interconnect dielectric material layer 10 containing at least one opening that can be employed in accordance with another embodiment of the present application.

The interconnect dielectric material layer 10 employed in this embodiment of the present application includes one of the interconnect dielectric materials mentioned above for the exemplary semiconductor structure shown in FIG. 1. The interconnect dielectric material layer 10 of this embodiment of the present application may be formed and have a thickness as described for the interconnect dielectric material layer 10 shown in FIG. 1.

The opening that is formed into the interconnect dielectric material layer 10 of this embodiment of the present can be formed and have a shape (via, line or combined via/line) as defined in providing the opening in the interconnect dielectric material layer 10 shown in FIG. 1.

The diffusion barrier material layer 12L includes one of the diffusion barrier materials mentioned above in providing the diffusion barrier liner 12 shown in FIG. 1. The diffusion barrier material layer 12L may be formed and have a thickness as defined above for the diffusion barrier material used to provide the diffusion barrier liner 12 shown in FIG. 1.

Figure 13:
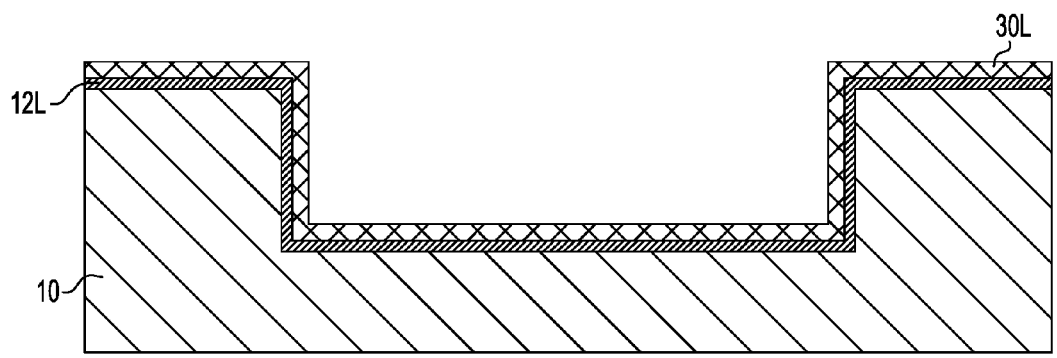
FIG. 13 is a cross sectional view of the exemplary semiconductor structure of FIG. 12 after forming a metal layer on the diffusion barrier layer.

Referring now to FIG. 13, there is illustrated the exemplary semiconductor structure of FIG. 12 after forming a metal layer 30L on the diffusion barrier layer 12L. The metal layer 30L is a continuous layer of metal, M2, that is formed on the entirety of the diffusion barrier layer 12L. The metal layer 30L may be composed of Al, Hf, Mn, Co, Ru, Ir, Rh, or W. The metal layer 30L may have a thickness from 10 nm to 25 nm. Other thicknesses that are lesser than 10 nm, and greater than 25 nm can also be employed as the thickness of the metal layer 30L as long as the metal layer 30L does not completely fill the volume of the opening.

The metal layer 30L may be formed utilizing a deposition process such as, for example, physical vapor deposition (PVD), chemical vapor deposition (CVD), plasma enhanced chemical vapor deposition (PECVD), atomic layer deposition (ALD), or electroless deposition. The deposition of the metal layer 30L is performed utilizing a carrier gas such as, for example, helium, in which the flow rate thereof is controlled so as to be less than 20 sccm. In one example, the flow rate of the carrier gas used during the deposition of the metal layer 30L is from 1 sccm to 15 sccm. The deposition of the metal layer 30L can be performed at a temperature from 25° C. to 500° C.

In some embodiments, an optional plating seed layer (not specifically shown) can be formed on the surface of the metal layer 30L. The optional plating seed layer is employed to selectively promote subsequent electroplating of a pre-selected interconnect metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

Figure 14:
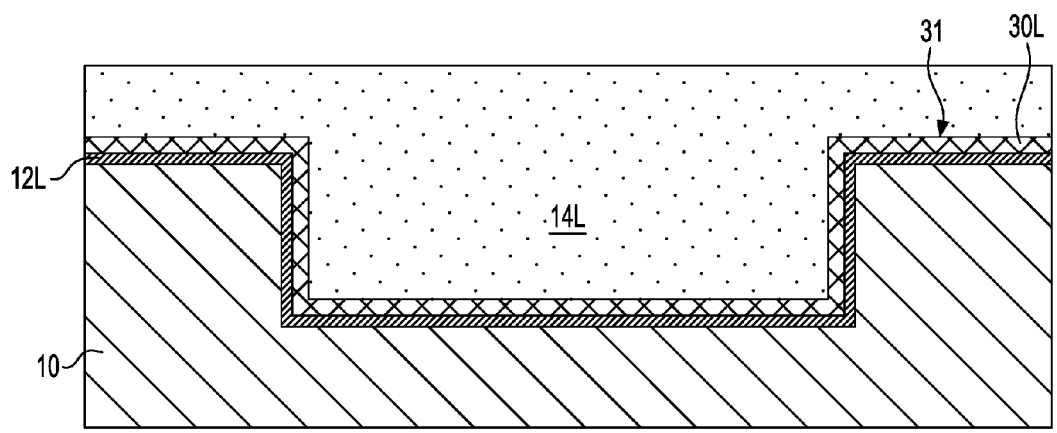
FIG. 14 is a cross sectional view of the exemplary semiconductor structure of FIG. 13 after forming a layer of an interconnect metal or metal alloy.

Referring now to FIG. 14, there is illustrated the exemplary semiconductor structure of FIG. 13 after forming a layer of an interconnect metal or metal alloy 14L. The layer of interconnect metal or metal alloy 14L is formed atop the metal layer 30L and is located inside and outside of the opening that is formed into the interconnect dielectric material layer 10.

The layer of interconnect metal or metal alloy 14L may be formed by a deposition process including chemical vapor deposition (CVD), plasma enhanced chemical vapor deposition (PECVD), sputtering, chemical solution deposition or plating. In one embodiment, a bottom-up plating process is employed in forming the layer of interconnect metal or metal alloy 14L. The layer of interconnect metal or metal alloy 14L may include Cu, Al, or an alloy of Cu—Al. In this embodiment, M1, represent the interconnect metal or metal alloy.

At this point of the present application, and as shown in FIG. 14, a well defined material interface 31 exists between the layer of interconnect metal or metal alloy 14L and metal layer 30L. For structures containing such a well defined interface 31, the quality of the interface 31 is critical for achieving electromigration resistance, e.g., free of oxygen and a limited amount of carbon.

Figure 15:
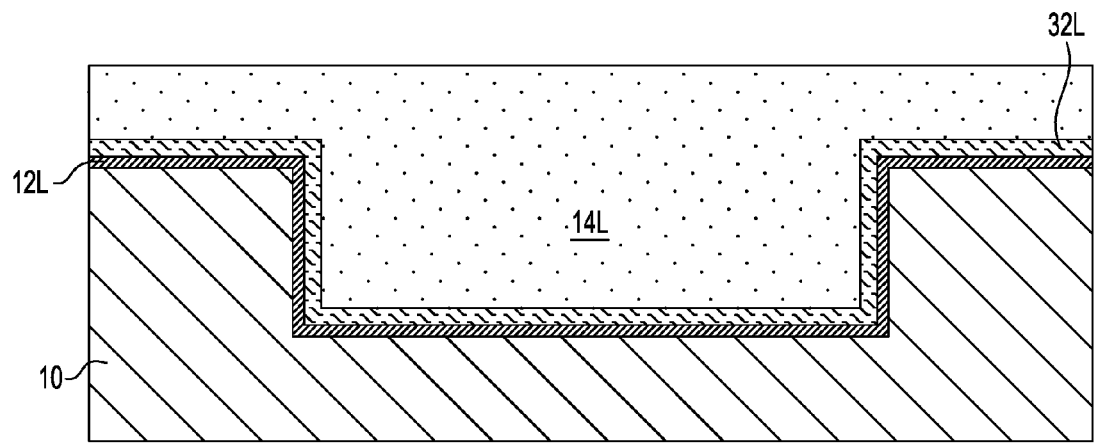
FIG. 15 is a cross sectional view of the exemplary semiconductor structure of FIG. 14 after performing an anneal in which the interconnect metal or metal alloy of the layer of interconnect metal or metal alloy reacts with the metal layer forming an intermetallic compound containing layer.

Referring now to FIG. 15, there is illustrated the exemplary semiconductor structure of FIG. 14 after performing an anneal in which the interconnect metal or metal alloy, M1, of the layer of interconnect metal or metal alloy 14L reacts with the metal, M2, of the metal layer 30L forming an intermetallic compound containing layer 32L (M1-M2). In the present application, the intermetallic compound containing layer 32L has a different composition than the diffusion barrier layer 12L.

In the present application, the intermetallic compound containing layer 32L is a metal alloy (i.e., M1-M2) that is formed by annealing and includes a combination of the metal or metal alloy, M1, of the layer of interconnect metal or metal alloy 14L and the metal, M2, of metal layer 30L. For example, when the layer of interconnect metal or metal alloy 14L include Cu, and the metal layer 30L includes Co, an intermetallic compound (i.e., alloy) of Cu—Co is formed.

The formation of the intermetallic compound containing layer 32L removes the well defined interface between the metal layer 30L and the metal or metal alloy of the layer of interconnect metal or metal alloy 14L thus relaxing the need for providing a high quality interface.

The intermetallic compound containing layer 32L that is formed has a graded concentration of the metal or metal alloy of the layer of interconnect metal or metal alloy 14L that is greatest at the interface between the intermetallic compound containing layer 32L and the layer of interconnect metal or metal alloy 14L and decreases downwards from this interface. Within the layer of interconnect metal or metal alloy 14L, the concentration of the metal or metal alloy that provides the layer of interconnect metal or metal alloy 14L is lower after the anneal than the initial concentration of metal or metal alloy in the layer of interconnect metal or metal alloy 14L prior to the anneal. The anneal used in this embodiment of the present application include the thermal anneal or laser anneal mentioned in the previous embodiments of the present application.

Figure 16:
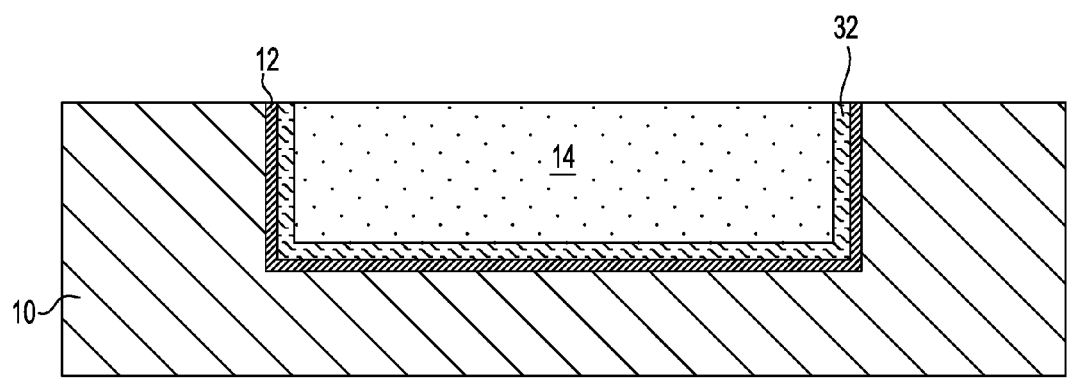
FIG. 16 is a cross sectional view of the exemplary semiconductor structure of FIG. 15 after performing a planarization process.

Referring now to FIG. 16, there is illustrated the exemplary semiconductor structure of FIG. 15 after performing a planarization process such as for example, chemical mechanical planarization and/or grinding. The planarization process removes the layer of interconnect metal or metal alloy 14L, the intermetallic compound containing layer 32L and the diffusion barrier material layer 12L that is present outside the opening and above the topmost surface of the interconnect dielectric material layer 10. Portions of the layer of interconnect metal or metal alloy 14L, the intermetallic compound containing layer 32L and the diffusion barrier material layer 12L remain in the opening. The remaining portion of the layer of interconnect metal or metal alloy 14L in the opening may be referred to as an interconnect metallic region 14, the remaining portion of the intermetallic compound containing layer 32L may be referred to an intermetallic compound containing liner 32, while the remaining portion of the diffusion barrier material layer 12L may be referred to herein as a diffusion barrier liner 12.

As is shown, topmost surfaces of the interconnect metallic region 14, the intermetallic compound containing liner 32 and the diffusion barrier liner 12 are coplanar with each other as well as coplanar with a topmost surface of the interconnect dielectric material layer 10.

Figure 17:
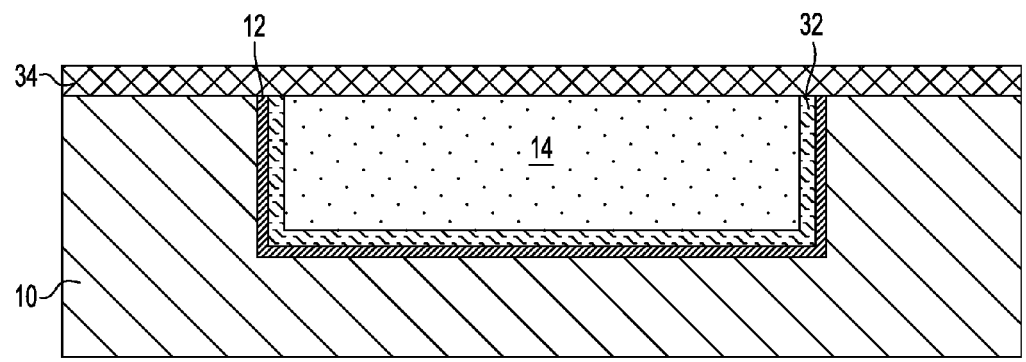
FIG. 17 is a cross sectional view of the exemplary semiconductor structure of FIG. 16 after forming a capping material layer.

Referring now to FIG. 17, there is illustrated the exemplary semiconductor structure of FIG. 16 after forming a capping material layer 34. In one embodiment of the present application, the capping material layer 34 may include one of the dielectric capping materials mentioned above in forming the dielectric capping layer 18 in the exemplary semiconductor structure shown in FIG. 3. The dielectric capping material may be formed and have a thickness as described above. In other embodiments, the capping material layer 34 may include a metal as mentioned above for metal cap 16. In such an embodiment, the metal that provides the capping material layer 34 may be formed by a non-selective deposition process as mentioned above in forming metal layer 22. The metal that provides the capping material layer 34 may be formed and have a thickness as described above. In some embodiments, and when the capping material layer 24 is a metal, the processing steps described above in FIGS. 7-11 may be performed to provide an intermetallic compound as the cap.

Figure 18:
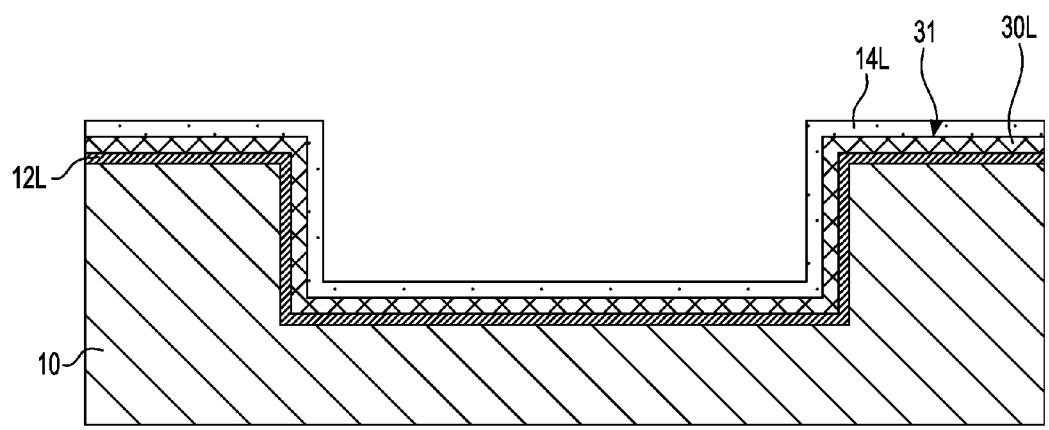
FIG. 18 is a cross sectional view of the exemplary semiconductor structure of FIG. 13 after forming a layer of an interconnect metal or metal alloy in accordance with another embodiment of the present application.

Referring now to FIG. 18, there is illustrated the exemplary semiconductor structure of FIG. 13 after forming a layer of an interconnect metal or metal alloy 14L in accordance with another embodiment of the present application. The layer of interconnect metal or metal alloy 14L is formed atop the metal layer 30L and is located inside and outside of the opening that is formed into the interconnect dielectric material layer 10. Although not shown, the thickness of the layer of interconnect metal or metal alloy 14L to the periphery of the illustrated structure is much thicker than the thickness of the layer of interconnect metal or metal alloy 14L within the illustrated area of the structure.

In this embodiment, the layer of interconnect metal or metal alloy 14L may be formed by a deposition process including PVD, chemical vapor deposition (CVD), plasma enhanced chemical vapor deposition (PECVD), sputtering, chemical solution deposition or plating. In one embodiment, a bottom-up plating process is employed in forming the layer of interconnect metal or metal alloy 14L. The layer of interconnect metal or metal alloy 14L may include Cu, Al, or an alloy of Cu—Al. Again, M1 denotes the interconnect metal or metal alloy.

At this point of the present application, and as shown in FIG. 18, a well defined material interface 31 exists between the layer of interconnect metal or metal alloy 14L and metal layer 30L. For structures containing such a well defined interface 31, the quality of the interface 31 is critical for achieving electromigration resistance, e.g., free of oxygen and a limited amount of carbon.

Figure 19:
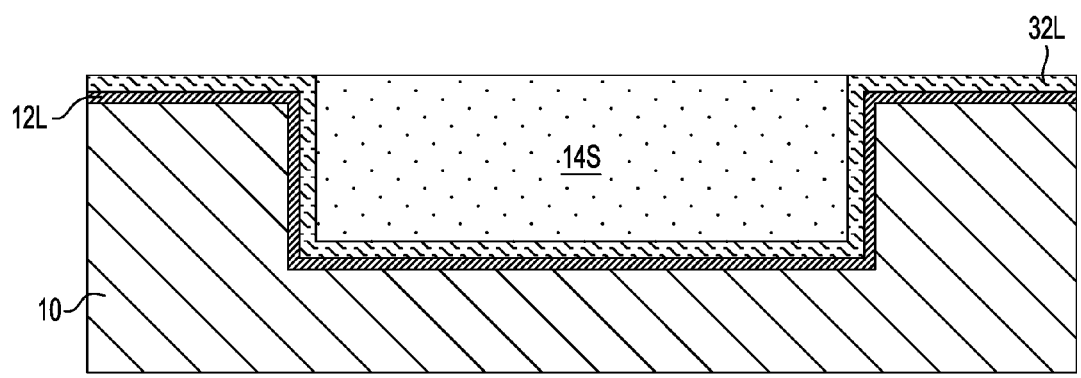
FIG. 19 is a cross sectional view of the exemplary semiconductor structure of FIG. 18 after performing a reflow anneal in which the interconnect metal or metal alloy of the layer of interconnect metal or metal alloy flows into the opening providing an interconnect metal structure, and wherein the interconnect metal or metal alloy of the layer of interconnect metal or metal alloy reacts with the metal layer to form am intermetallic compound containing diffusion barrier layer.

Referring now to FIG. 19, there is illustrated the exemplary semiconductor structure of FIG. 18 after performing a reflow anneal in which the interconnect metal or metal alloy, M1, is flow into the opening providing an interconnect metallic structure 14S, and wherein the interconnect metal or metal alloy, M1, of the layer of interconnect metal or metal alloy 14L reacts with the metal, M2, of the metal layer 30L to form am intermetallic compound containing layer 32L (i.e., M1-M2). In the present application, the intermetallic compound containing layer 32L has a different composition than the diffusion barrier layer 12L.

In the present application, the intermetallic compound containing layer 32L is a metal alloy (M1-M2) that is formed by the reflow anneal and includes a combination of the metal or metal alloy, M1, of the layer of interconnect metal or metal alloy 14L and the metal, M2, of metal layer 30L. For example, when the layer of interconnect metal or metal alloy 14L include Cu, and the metal layer 30L includes Co, an intermetallic compound (i.e., alloy) of Cu—Co is formed.

The formation of the intermetallic compound containing layer 32L removes the well defined interface between the metal layer 30L and the metal or metal alloy of the layer of interconnect metal or metal alloy 14L thus relaxing the need for providing a high quality interface.

The intermetallic compound containing layer 32L that is formed has a graded concentration of the metal or metal alloy of the layer of interconnect metal or metal alloy 14L that is greatest at the interface between the intermetallic compound containing layer 32L and the layer of interconnect metal or metal alloy 14L and decreases downwards from this interface. Within the layer of interconnect metal or metal alloy 14L, the concentration of the metal or metal alloy that provides the layer of interconnect metal or metal alloy 14L is lower after the reflow anneal than the initial concentration of metal or metal alloy in the layer of interconnect metal or metal alloy 14L prior to the reflow anneal.

In this embodiment of the present application, the reflow anneal is a thermal anneal. In one example, the reflow anneal may include a furnace anneal or a hot plate anneal. The reflow anneal may be performed at a temperature from 100° C. to 400° C. Other temperatures can also be employed so long as the selected reflow anneal temperature cause the reflow of the metal or metal alloy of the layer of interconnect metal or metal alloy 14L and formation of the intermetallic compound containing layer 32L.

The reflow anneal is typically performed in a nitrogen-containing ambient such as defined above. The duration of the reflow anneal may vary depending upon the temperature used during the thermal anneal. In one embodiment and for a temperature from 100° C. to 500° C., the reflow anneal may be performed for a duration of 20 minutes to 3 hours.

Although not shown, the exemplary semiconductor structure of FIG. 19 can be subjected to a planarization process such as described above so as to provide a planar structure as shown, for example, in FIG. 17.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An interconnect structure comprising:
   at least one interconnect metallic region of an interconnect metal or metal alloy, M1, embedded in an opening located in an interconnect dielectric material layer, wherein a topmost surface of said at least one interconnect metallic region is coplanar with a topmost surface of said interconnect dielectric material layer;
   an intermetallic compound containing cap located on said topmost surface of said at least one interconnect metallic region, wherein said intermetallic compound containing cap is a metal alloy including M1 and another metal, M2, wherein M2 is different from M1, wherein M2 is selected from the group consisting of Al, Mn, Co, Ru, Ir, Rh, and W; and
   a dielectric capping layer located on exposed portions of said topmost surface of said interconnect dielectric material and on sidewall surfaces and a topmost surface of said intermetallic compound containing cap.

2. The interconnect structure of claim 1, wherein a diffusion barrier liner is present between said least one interconnect metallic region and said interconnect dielectric material layer.

3. The interconnect structure of claim 1, wherein M1 is selected from the group consisting of Cu, Al and Cu—Al.

4. The interconnect structure of claim 1, wherein said intermetallic compound containing cap has a graded concentration of M1, wherein a content of M1 in said intermetallic compound containing cap is greatest at an interface formed between said intermetallic compound containing cap and said at least one interconnect metallic region, and decreases upwards to an interface formed between a topmost surface of said intermetallic compound containing cap and a surface of said dielectric capping layer.

5. The interconnect structure of claim 1, wherein said intermetallic compound containing cap has sidewall surfaces that are vertically aligned to sidewall surfaces of said at least one interconnect metallic region.

6. The interconnect structure of claim 1, wherein said dielectric capping layer comprises SiC, $Si_4NH_3$, $SiO_2$, a carbon doped oxide, a nitrogen and hydrogen doped silicon carbide SiC(N,H) or multilayers thereof.

7. The interconnect structure of claim 1, wherein M1 is Cu.

8. A method of forming an interconnect structure, said method comprising:
   forming at least one interconnect metallic region of an interconnect metal or metal alloy, M1, embedded in an opening located in an interconnect dielectric material layer, wherein a topmost surface of said at least one interconnect metallic region is coplanar with a topmost surface of said interconnect dielectric material layer;
   depositing a metal cap of metal, M2, selectively on said topmost surface of said at least one interconnect metallic region, wherein M2 is different from M1, wherein M2 is different from M1, wherein M2 is selected from the group consisting of Al, Mn, Co, Ru, Ir, Rh, and W; and
   converting said metal cap into an intermetallic compound containing cap, wherein said intermetallic compound containing cap is a thermal reaction product of M1 and M2.

9. The method of claim 8, wherein said converting comprises a thermal anneal.

10. The method of claim 8, wherein said converting comprises a laser anneal.

11. The method of claim 8, further comprising forming a dielectric capping layer on exposed surfaces of said interconnect dielectric material layer and said metal cap prior to said converting.

12. The method of claim 8, further comprising forming a dielectric capping layer on exposed surfaces of said interconnect dielectric material and said intermetallic compound containing cap after said converting.

13. The method of claim 8, wherein a content of M1 in said interconnect metallic region after said converting is lower than a content of M1 in said interconnect metallic region prior to said converting.

14. The method of claim 8, wherein M1 is selected from the group consisting of Cu, Al and Cu—Al.

15. The method of claim 8, wherein said intermetallic compound containing cap has a graded concentration of M1, wherein a content of M1 in said intermetallic compound containing cap is greatest at an interface formed between said intermetallic compound containing cap and said at least one interconnect metallic region, and decreases upwards from said interface.

16. The method of claim 9, wherein said thermal anneal is performed in a nitrogen-containing ambient and at a temperature from 100° C. to 400° C.

17. The method of claim 10, wherein said laser anneal is performed in a nitrogen-containing ambient and at a temperature from 400° C. to 800° C.

* * * * *